US011320942B2

(12) United States Patent
Kitada

(10) Patent No.: US 11,320,942 B2
(45) Date of Patent: *May 3, 2022

(54) PRESSING SENSOR

(71) Applicant: Murata Manufacturing Co., Ltd., Nagaokakyo (JP)

(72) Inventor: Hiroaki Kitada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/239,896

(22) Filed: Apr. 26, 2021

(65) Prior Publication Data
US 2021/0240289 A1 Aug. 5, 2021

Related U.S. Application Data

(63) Continuation of application No. PCT/JP2020/015863, filed on Apr. 8, 2020.

(30) Foreign Application Priority Data

May 10, 2019 (JP) .............................. JP2019-089621

(51) Int. Cl.
G06F 3/044 (2006.01)
H01L 41/08 (2006.01)
H01L 41/113 (2006.01)
G06F 3/041 (2006.01)

(52) U.S. Cl.
CPC ............ *G06F 3/044* (2013.01); *G06F 3/0448* (2019.05); *H01L 41/0805* (2013.01); *H01L 41/1132* (2013.01)

(58) Field of Classification Search
USPC ........................................................ 345/173
See application file for complete search history.

(56) References Cited

U.S. PATENT DOCUMENTS

| | | | |
|---|---|---|---|
| 2013/0057499 A1* | 3/2013 | Ando | G06F 3/04142 345/173 |
| 2014/0049137 A1* | 2/2014 | Ando | G01B 7/16 310/330 |
| 2015/0247765 A1* | 9/2015 | Ando | H01L 41/1132 310/331 |
| 2016/0153845 A1* | 6/2016 | Kawamura | G01L 9/008 73/862.629 |
| 2016/0195971 A1* | 7/2016 | Ando | G06F 3/0445 345/174 |
| 2016/0357331 A1* | 12/2016 | Kano | G06F 3/0416 |
| 2017/0131806 A1* | 5/2017 | Ando | G06F 3/0414 |
| 2017/0160872 A1* | 6/2017 | Mori | G06F 3/0446 |
| 2017/0177106 A1* | 6/2017 | Kihara | H03K 17/9643 |
| 2017/0192550 A1* | 7/2017 | Kano | G06F 3/04144 |

\* cited by examiner

*Primary Examiner* — Chineyere D Wills-Burns
(74) *Attorney, Agent, or Firm* — ArentFox Schiff LLP

(57) ABSTRACT

A pressing sensor includes a piezoelectric film and first and second detection electrodes. The piezoelectric film has a chiral polymer drawn at least in a uniaxial direction, and has a first main surface and a second main surface. The first and second detection electrodes are arranged on at least one of the first and second main surfaces. The first and second detection electrodes are arranged so as to face each other obliquely to the uniaxial direction.

9 Claims, 6 Drawing Sheets

PRESSING SENSOR

CROSS REFERENCE TO RELATED APPLICATIONS

The present application is a continuation of International application No. PCT/JP2020/015863, filed Apr. 8, 2020, which claims priority to Japanese Patent Application No. 2019-089621, filed May 10, 2019, the entire contents of each of which are incorporated herein by reference.

FIELD OF THE INVENTION

The present invention relates to a pressing sensor that detects a pressing operation.

BACKGROUND OF THE INVENTION

Japanese Patent No. 6132076 (Patent Document 1) discloses a pressing sensor that detects a pressing operation. As explained therein, when the entire circumference of an operation surface is fixed to a housing, the potential generated in a piezoelectric element may be reversed with respect to the warping of the operation surface depending on a pressing position, causing the output to be reduced or reversed. Patent Document 1 suppresses the reverse potential from being generated by ensuring that the shape of the lateral section of a holding member is different from the shape of the longitudinal section thereof.

A problem with this proposed solution is that the operation surface warps differently depending on whether the operation surface is pressed, in plan view, in the vicinity of the center or at the end. Therefore, depending on the pressing position, the pressing operation may not be detected.

An object of the present invention is to provide a pressing sensor that can detect the pressing regardless of the pressing position.

BRIEF DESCRIPTION OF THE INVENTION

The pressing sensor of the present invention includes a piezoelectric film and a detection electrode. The piezoelectric film has a chiral polymer drawn at least in a uniaxial direction, and has a first main surface and a second main surface. The detection electrode is arranged on the first main surface or the second main surface. The detection electrode has a first electrode and a second electrode that are arranged so as to face each other obliquely to the uniaxial direction.

The piezoelectric film most efficiently detects stretching and contraction in the direction of 45 degrees with respect to the uniaxial direction (drawing direction). In addition, potentials of the same polarity are generated at the locations where the electrodes face each other obliquely to the drawing direction. The pressing sensor of the present invention has a high sensitivity by having the first electrode and the second electrode arranged so as to face each other obliquely to the drawing direction. Further, even when the center of the operation surface is pressed or the end of the operation surface is pressed, the potentials of the same polarity are acquired at the locations facing each other obliquely to the drawing direction, therefore, the pressing sensor of the present invention can detect the pressing regardless of the pressing position.

According to the present invention, the pressing operation can be detected regardless of the pressing position.

DESCRIPTION OF THE PREFERRED EMBODIMENT

Figure 1:
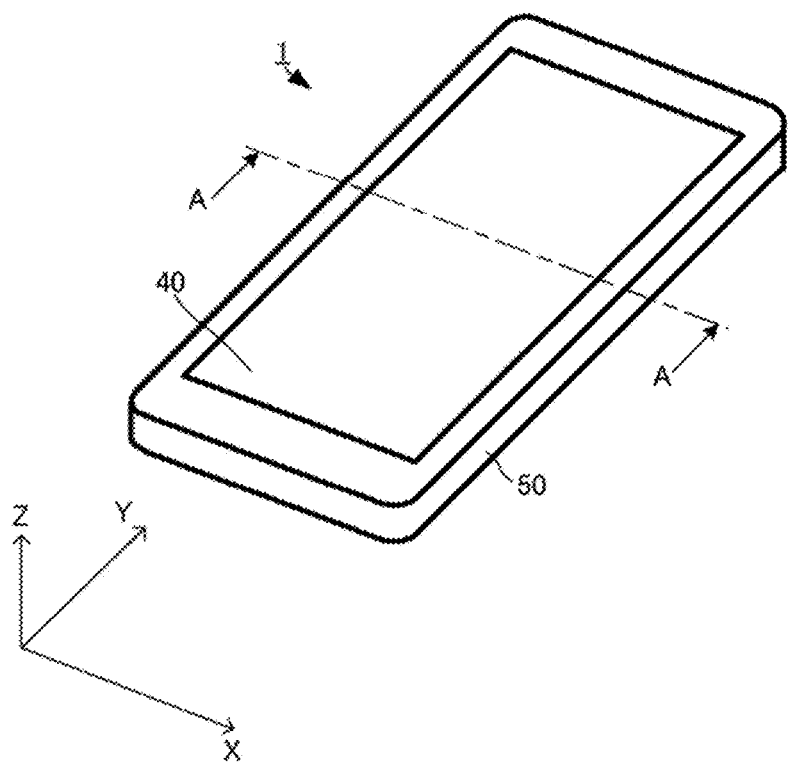
FIG. 1 is an external perspective view of a display device provided with a touch panel.
Figure 2:
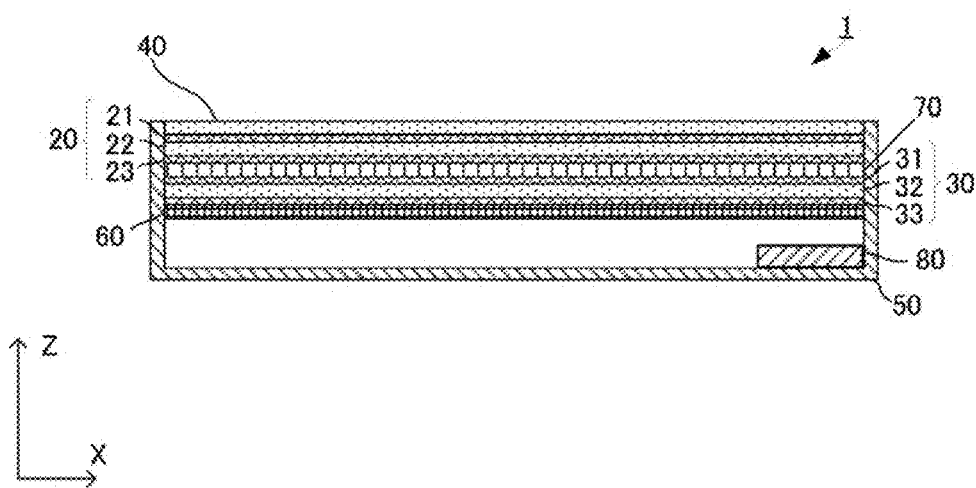
FIG. 2 is a side sectional view of the display device taken along section A-A of FIG. 1.

Referring now to the drawings, wherein like numerals indicate like elements, exemplary pressing sensors in accordance with the present invention, FIGS. 1 and 2 show an exemplary pressing sensor 30 used as part of a display device 1. The display device 1 can be an information processing device such as a smartphone or a tablet. In the preferred embodiment, the display device has a generally rectangular parallelepiped shape with a thickness lying in the Z direction, a width lying in the X direction and a length lying in the Y direction.

The display device includes a housing 50 having a generally rectangular parallelepiped shape and a surface or touch panel 40 having a flat, planar shape and being arranged in an opening on the upper face of the housing 50. The upper surface of the surface panel 40 functions as an operation surface on which a user can perform touch and pressing operations using, for example, his or her finger or a pointer device such as a pen.

As best shown in FIG. 2, a touch sensor 20, a pressing sensor 30, and a display panel 60 are arranged inside the housing 50 in order from the opening (surface panel 40) side of the housing 50 in the Z direction. This sequence is not require and, for example, the positions of the touch sensor 20 and the pressing sensor 30 can be reversed.

In the preferred embodiment, the touch sensor 20, the pressing sensor 30, the surface panel 40, and the display panel 60 all have a flat, planar, plate like shape and are rectangular in plan view (i.e., as viewed along a plane running parallel to the major plane of the housing—that is, parallel to the X-Y axis). The upper, main surfaces of the touch and pressing sensors 20 and 30 face the surface panel 40. As viewed in FIG. 2, the upper main surface of the touch sensor 20 is connected to (and preferably touches) the lower main surface of the surface panel 40. The lower main surface of the touch sensor 20 is connected to the pressing sensor 30 using an adhesive 70.

A circuit board 80 is arranged in the housing 50 and is electrically connected to the touch sensor 20, the pressing sensor 30, the surface panel 40, or the display panel 60 by a flexible cable (not shown). The circuit board 80 may, for example, be integrated with the flexible cable by using a bendable board material such as a flexible board, or may be formed as a part of the main board.

The touch sensor 20 is preferably a capacitive type sensor comprising a an insulating board 22 having first and second electrodes located on opposed sides thereof. The insulating board 22 is preferably made of a transparent material, for example, an acrylic resin (polymethyl methacrylate, PMMA).

Figure 3:
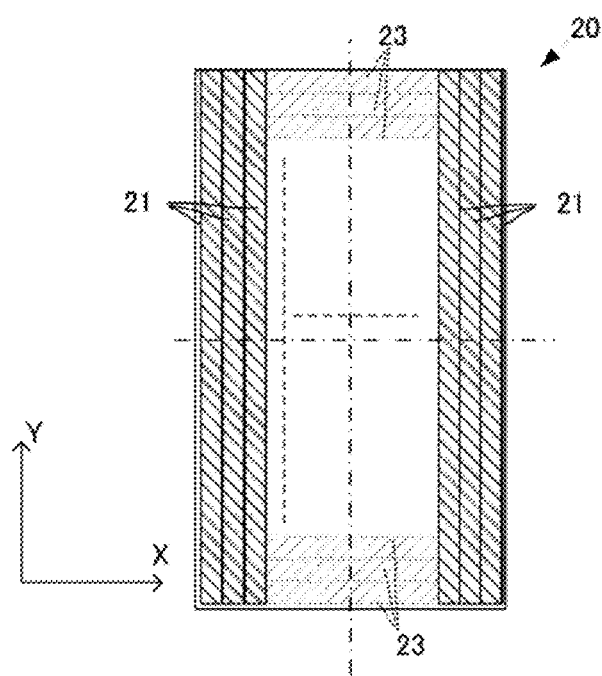
FIG. 3 is a plan view showing an exemplary electrode arrangement that can be used as a touch sensor.

As best shown in FIG. 3, the first electrodes 21 are arranged on the upper main surface of the insulating board 22 and each have a rectangular shape that is elongated in the Y direction. The first electrodes 21 are spaced apart from each other in the X direction, preferably at regular intervals.

The second electrode 23 are arranged on the lower main surface of the insulating board 22 and each have a rectangular shape that is elongated in the X direction. The second electrodes 23 are spaced apart from each other in the Y direction, preferably at regular intervals.

The first and second electrodes 21 and 23 are preferably made of a transparent material such as a material containing indium tin oxide (ITO), zinc oxide (ZnO), silver nanowires, or polythiophene, as a main component. The pressing sensor 30 may be arranged on the lower surface side of the display panel 60. In this case, it may not be necessary for the first and second electrodes 21 and 23 to be transparent.

As best shown in FIGS. 2, 4(A), 4(B) and 5, the pressing sensor 30 includes a detection electrode 31 (more particularly, a pair of detection electrodes 31A and 31B), a piezoelectric film 32, and a ground electrode 33 in this order from the surface panel 40 side. The detection electrodes 31A and 31B and the ground electrode 33 are preferably made of a transparent material such as a material containing indium tin oxide (ITO), zinc oxide (ZnO), silver nanowires, or polythiophene as a main component.

When the user presses the operation surface of the surface panel 40, the piezoelectric film 32 warps in a normal direction (in the Z direction) to generate an electric charge. The piezoelectric film 32 is preferably made of a transparent material and is preferably made of a chiral polymer. More preferably, the piezoelectric film 32 is preferably polylactic acid (PLA), further, poly-L-lactic acid (PLLA), drawn along at least the uniaxial direction.

In the chiral polymer, a main chain has a helical structure, and when the main chain is uniaxially drawn and molecules are aligned, the polymer generates piezoelectricity. The amount of charge generated by the uniaxially drawn chiral polymer is uniquely determined by the shear strain applied along the molecular axis of the spiral molecule (as a result of deformation of the polymer).

A piezoelectric constant of the uniaxially drawn PLLA belongs to an extremely high class among polymers. That is, a pressing operation of the user can be detected with high sensitivity, and a signal corresponding to an amount of pressing can be output with high accuracy.

In addition, the chiral polymer does not need to undergo the poling treatment because piezoelectricity is generated by the molecular orientation treatment such as drawing. Furthermore, because polylactic acid is not pyroelectric, the amount of charge to be detected does not change even when heat from the finger or the line of the user is transmitted. In addition, the pressing sensitivity is not affected by the heat generated by the device or the ambient temperature. In particular, polylactic acid is effective for use in small electronic devices such as smartphones or tablet terminals in which a battery that easily generates heat and a piezoelectric film are arranged close to each other. Further, the piezoelectric constant of polylactic acid does not fluctuate with time and is extremely stable.

When the surface panel 40 is pressed by the user (i.e., the user creates a downward force in the −Z direction), the piezoelectric film 32 stretches and contracts in the horizontal direction. It is desirable to arrange the molecular axis such that the stretching and contraction due to the pressing operation causes shear strain with respect to the molecular axis of the spiral molecule. In the uniaxially drawn polylactic acid film, the spiral molecules that contribute to the piezoelectricity are oriented along the drawing axis direction. In the present embodiment, the sides of the piezoelectric film 32 are arranged in the X and Y directions. The drawing direction may be arranged at an angle of 0±10 degrees with respect to the sides of the piezoelectric film.

A drawing ratio is preferably about three to eight times. By performing heat treatment after drawing, crystallization of drawn chain crystals of polylactic acid is promoted and the piezoelectric constant is improved. Further, in the case of performing biaxial drawing, the same effect as the uniaxial drawing can be obtained by changing the drawing ratio of each axis. For example, assuming that a certain direction is the X-axis and polylactic acid is drawn by eight times in the X-axis direction and by twice in the Y-axis direction orthogonal to the X-axis, regarding the piezoelectric constant, the effect of approximately the same as uniaxially drawing the polylactic acid by four times in the X-axis direction can be obtained. Because the uniaxially drawn film is easily torn along the drawing axis direction, the strength can be increased to some extent by performing the biaxial drawing as described above.

Figure 5:
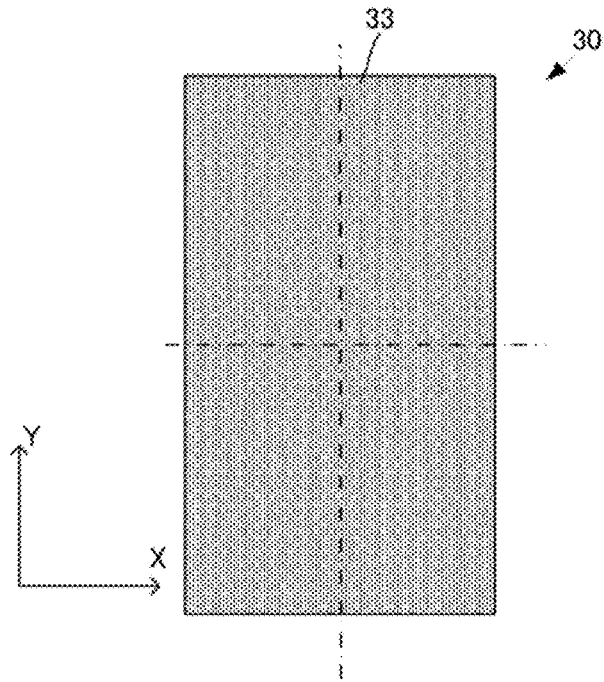
FIG. 5 is a plan view showing the arrangement of a ground electrode of the pressing sensor.

The above-described detection electrodes 31A and 31B are arranged on the upper main surface of the piezoelectric film 32, and the ground electrode 33 is arranged on the lower main surface thereof. As shown in FIG. 5, the ground electrode 33 is preferably arranged so as to cover substantially the entire lower surface of the piezoelectric film 32.

Figure 4A:
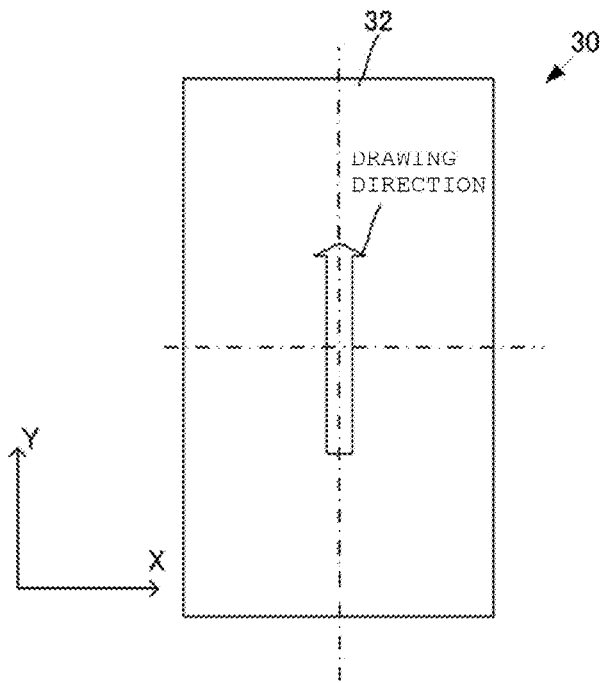
FIG. 4(A) is a plan view of a piezoelectric film of a pressing sensor.
Figure 4B:
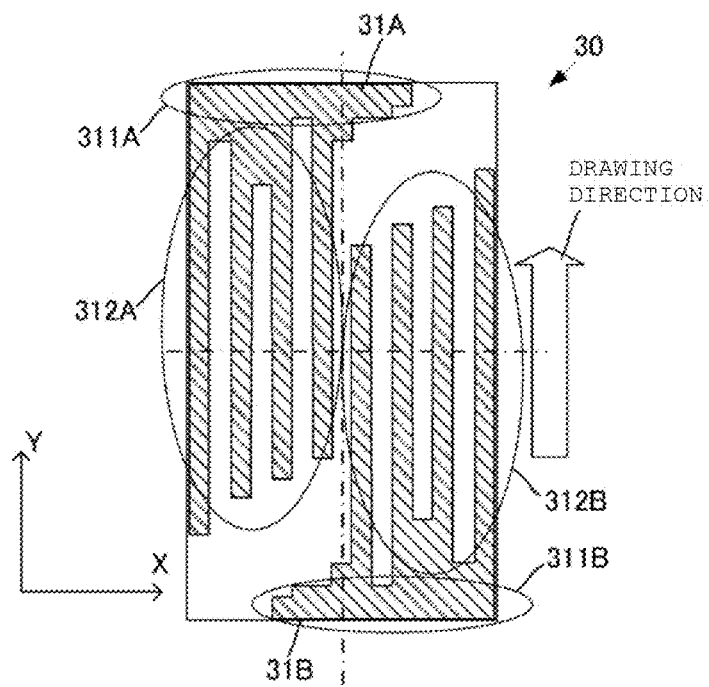
FIG. 4(B) is a plan view showing the arrangement of a detection electrode of the pressing sensor.

As shown in FIG. 4(B), the detection electrodes 31A and 31B each have the same shape and are arranged to face one another obliquely to the drawing direction of the piezoelectric film 32. The first detection electrode 31A has a base part 311A formed at the upper left corner of the piezoelectric film 32 and an extension part 312A extending downwardly from the base part 311A along the drawing direction (the −Y direction). The extension part 312A comprises a plurality of finger like extensions, each of which extends from the base part 311A in the drawing direction (in the −Y direction of the figure). The lengths of the finger like extensions (as measured from the upper edge of the piezoelectric film 32) vary such that the longest extension is located adjacent the left lateral edge of the piezoelectric film 32 and the shortest extension is located in the middle of the piezoelectric film. Each successive extension is longer than the adjacent extension as shown in the figures so that the distal edges of the extensions form a diagonal line with respect to the drawing direction.

The second detection electrode 311B has a base part 311B formed at the lower right corner of the piezoelectric film 32 and an extension part 312B extending upwardly from the base part 311B along the drawing direction (in the +Y direction). The extension part 311B comprises a plurality of finger like extensions, each extending from the base part 311A in the drawing (Y) direction. The length of the finger like extensions (as measured from the bottom of the piezoelectric film as viewed in FIG. 4(B)) vary such that the longest extension is located adjacent the right lateral edge of the piezoelectric film 32 and the shortest extension is in the middle of the piezoelectric film 32. Each successive extension is longer than the adjacent extension so that the distal ends of the extensions form a diagonal line with respect to the drawing direction. The diagonals formed by the distal ends of the extension sections 312A and 312B preferably run parallel to one another. The finger like extensions of both detection electrodes preferably have shapes corresponding to the electrodes of the capacitive touch sensor 20 shown in FIG. 3.

The width of the extensions is preferably the same as the width of the first electrode 21. Further, the distal ends of the extensions are preferably located at boundaries of the plurality of respective ones of the second electrodes 23. Therefore, the pressing sensor 30 can reduce the visibility of the detection electrode 31.

As explained further below, the shape and position of the detection electrodes 31A and 31B are chosen so that they are highly sensitive to positive charges generated when the surface panel 40 is depressed and are less sensitive to negative charges generated when the surface panel 40 is depressed, irrespective of which portion of the surface panel 40 is depressed. This significantly increases the sensitivity of the pressing sensor.

Figure 6:
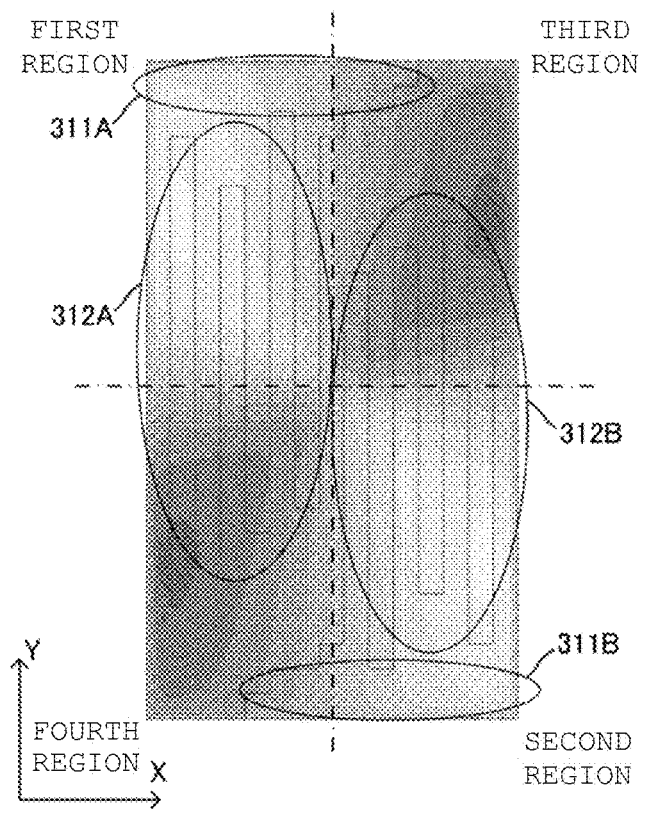
FIG. 6 is a plan view showing the distribution of potential generated in the piezoelectric film when the center of a surface panel is pressed.
Figure 7:
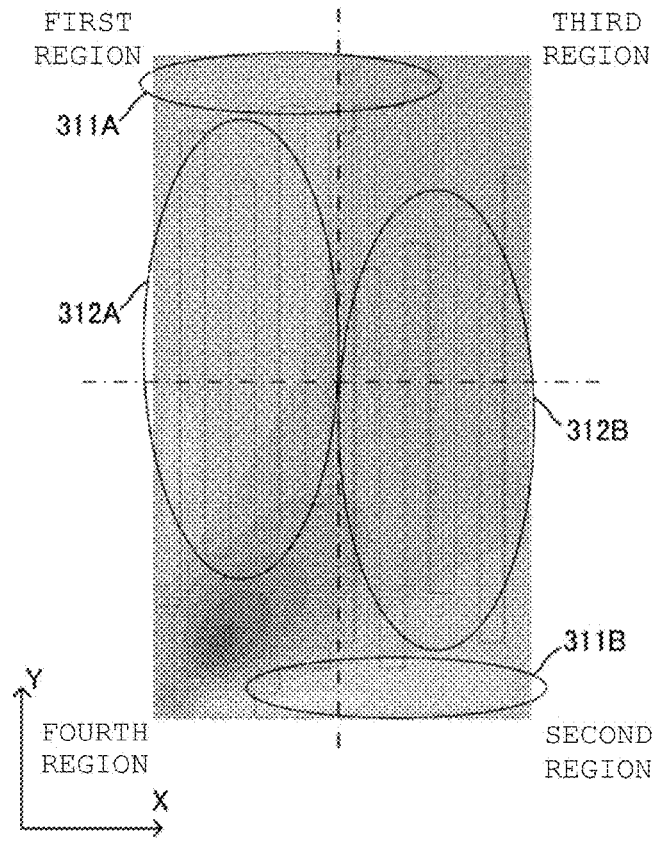
FIG. 7 is a plan view showing the distribution of potential generated in the piezoelectric film when the corner portion of the surface panel is pressed.

FIG. 6 is a plan view showing the distribution of potential generated in the piezoelectric film 32 when the center of a surface panel 40 is pressed. FIG. 7 is a plan view showing the distribution of potential generated in the piezoelectric film 32 when the corner portion of the surface panel 40 is pressed. In FIGS. 6 and 7, a positive potential is generated in the light portion and a negative potential is generated in the dark portion. The closer the color is to white, the higher the positive potential, and the closer the color is to black, the higher the negative potential. In the plan views shown in FIGS. 6 and 7, the piezoelectric film is divided into four quadrants. The upper left quadrant is referred to as a first region, the lower right quadrant is referred to as a second region, the upper right quadrant is referred to as a third region, and the lower left quadrant is referred to as a fourth region.

As shown in FIG. 6, when the center of the surface panel 40 is pressed, the piezoelectric film 32 generates a positive potential in the first and second regions. In contrast, the piezoelectric film 32 generates a negative potential in the third and fourth regions. Further, as shown in FIG. 7, when the lower left corner of the surface panel 40 is pressed, the piezoelectric film 32 generates the positive potential in the first and second regions as well as the portions of the fourth region sandwiching the pressed location. The piezoelectric film 32 generates a negative potential extending diagonally relative to the drawing direction from the pressed location. The shape and location of the detection electrodes 31A and 31B ensure a greater sensitivity to those areas where positive charges are generated and a lesser sensitivity to those areas where negative charges are generated.

As shown in FIG. 7, when a corner of the surface panel 40 is pressed, the piezoelectric film 32 generates a positive potential along the two sides sandwiching the pressed location. The diagonal line defined by the distal ends of the finger like extensions of the extension part 312A ensure that the positive charges are easily detected and the negative charges are detected with less sensitivity. More particularly, the finger like extensions of the extension part 312A extend over a large portion of the positive potential generated in the fourth region by only over a small portion of the negative potential generated in the fourth region.

More particularly, the negative potential has an elliptical distribution having its long axis which extends diagonally to the drawing direction. The line formed by the distal ends of the finger like extensions is parallel to and spaced from the long axis of the ellipse making it difficult for the finger like extensions to detect the negative potential. As a result, the pressing sensor 30 can accurately detect the pressing operation regardless of the pressing position, and even when the center of the surface panel 40 is pressed or the corner of the surface panel 40 is pressed. For the same reason, the line formed by the distal ends of the extension part 312B is preferably parallel to and spaced from the long axis of the ellipse.

It is preferable that the X-direction ends of the plurality of long parts of the extension part 312A are inclined with respect to the X direction so as to extend along the long axis of the ellipse. With this configuration, it is more difficult for the long parts of the extension part 312A to detect the negative potential. As a result, the pressing sensor 30 can accurately detect the pressing regardless of the pressing position, and even when the center of the surface panel 40 is pressed or the corner of the surface panel 40 is pressed. For the same reason, it is preferred that the distal ends of the plurality of long parts of the extension part 312B are inclined with respect to the X direction so as to extend along the long axis of the ellipse.

As shown in FIG. 6, when the center of the surface panel 40 is pressed, the extension part 312A and the extension part 312B are arranged across the first region and the second region that generate the positive potential to the third region and the fourth region that generate negative potential.

Therefore, the extension part 312A and the extension part 312B also detect the negative potential. On the other hand, when the corner of the surface panel 40 is pressed, the extension part 312A (or extension part 312B) detects the positive potential.

When the center of the surface panel 40 is pressed, the positive potential generated is much higher than when the end of the surface panel 40 is pressed. Therefore, the difference in the detected potentials becomes large between when the center of the surface panel 40 is pressed and when the end of the surface panel 40 is pressed. However, because the pressing sensor 30 also detects the negative potential by the extension part 312A and the extension part 312B, the potential detected when the end of the surface panel 40 is pressed is reduced. With this configuration, the pressing sensor 30 can reduce the difference in potentials caused by the pressing position, and can detect the pressing regardless of the pressing position.

Here, as shown in FIG. 6, when the center of the surface panel 40 is pressed, the position where the negative potential is most strongly generated is near the left edge of the piezoelectric film 32 (and therefore the left edge of the surface panel 40) and ends at a point approximately ¾ the way down from the top of the piezoelectric film. Therefore, it is preferable that distal end of the longest (leftmost) finger like extension of the extension part 312A be located near the point approximately ¾ the way down from the top of the piezoelectric film. With this configuration, the pressing sensor 30 efficiently detects the negative potential by the extension part 312A, so that the potential detected when the end portion of the surface panel 40 is pressed is reduced. As a result, the pressing sensor 30 can reduce the difference in potentials caused by the pressing position, and can detect the pressing regardless of the pressing position. For the same reason, it is preferable that the distal ends of the longest (right most) finger like extension of the extension part 312B be located approximately ¼ down from the top of the piezoelectric film 32.

Further, as shown in FIG. 6, when the center of the surface panel 40 is pressed, the position where the strongest positive potential is generated on the left hand side of the piezoelectric film 32 is approximately ¼ the way down from the top of the piezoelectric film 32. It is preferable that the portion of the solid part 311A located adjacent the left hand side of the piezoelectric film 32 is not located at this position. With this configuration, the solid part 311A is separated from the position where the positive potential is generated too strongly. As a result, the difference between the potentials detected when the center of the surface panel 40 is pressed and the potential detected when the end of the surface panel 40 is pressed becomes small.

As shown in FIGS. 4(B) and 6, the extension parts 312A and 312B are comb-shaped. Therefore, the areas of the extension parts 312A and 312B are smaller than the area of they would cover if they a solid conductor. With this configuration, the positive potential detected by the extension parts 312A and 312B when the center of the surface panel 40 is pressed is reduced. As a result, the difference between the potentials detected when the center of the surface panel 40 is pressed and the potential detected when the end of the surface panel 40 is pressed becomes small.

Further, because the extension parts 312A and 312B are comb-shaped, the first and second detection electrodes 31A and 31B cover most of the piezoelectric film 32 (and therefore most of the surface panel 40). The shapes of the first and second detection electrodes 31A and 31B become similar to the shape of the touch sensor 20. With this configuration, the visibility of the surface panel 40 is less likely to vary due to the presence of the first and second detection electrodes 31A and 31B. This effect is exerted even if the extension part 312A and the extension part 312B have a checkered pattern.

Because the extension parts 312A and 312B are comb-shaped, each of the first and second detection electrodes 31A and 31B is a single, continuous electrode and does not include separated portion (so-called floating island portions) that are not electrically connected. Therefore, the wiring can be easily connected to the first and second detection electrodes 31A and 31B. This effect is exerted even if the extension parts 312A and 312B have a checkered pattern.

Figure 8:
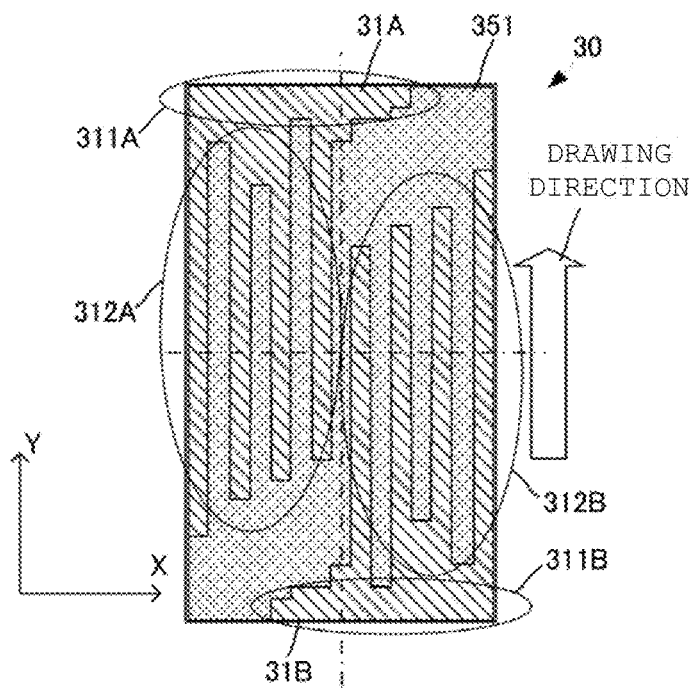
FIG. 8 is a plan view showing the arrangement of the detection electrode 31 of the pressing sensor according to a modified example.

FIG. 8 is a plan view showing the arrangement of the detection electrode 31 of the pressing sensor 30 according to a modified example. In this embodiment, the pressing sensor 30 has a ground (or dummy) electrode. Other configurations of the pressing sensor are the same as those shown in FIG. 4(B).

The ground electrode 351 is arranged at the location where the detection electrode is not arranged (where the detection electrodes are absent). The ground electrode 351 is preferably made of a transparent material such as a material containing indium tin oxide (ITO), zinc oxide (ZnO), silver nanowires, or polythiophene, as a main component.

According to the configuration of the first modified example, the electrodes are arranged on the second main surface of the piezoelectric film 32 over the entire surface as in the case of a solid electrode. Therefore, the visibility of the electrode can be further reduced.

In FIG. 8, the ground electrode 351 is a solid electrode. However, the ground electrode 351 does not have to be a solid electrode. The ground electrode 351 may have the same shape as the first electrode 21 or the second electrode 23 of the touch sensor 20 of FIG. 3. That is, the ground electrode 351 may be divided into a plurality of parts.

Figure 9:
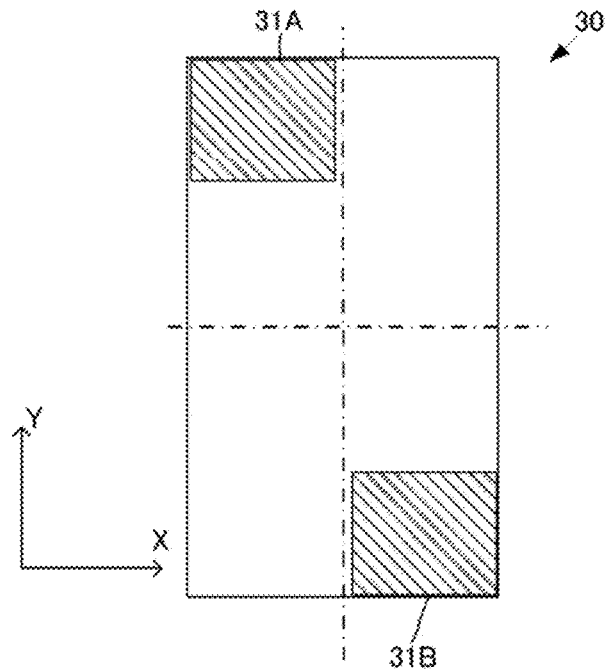
FIG. 9 is a plan view showing the arrangement of the detection electrode of the pressing sensor.

In the above embodiment, the first and second detection electrodes 31A and 31B have a respective solid part and a respective extension part. However, for example, as shown in FIG. 9, each of the first detection electrode 31A and the second detection electrode 31B may only have a solid part. In this case as well, when the center of the surface panel 40 is pressed as shown in FIG. 6 and the corner of the surface panel 40 is pressed as shown in FIG. 7, the positive potential is detected and the negative potential is not detected. Therefore, the pressing sensor 30 can detect the pressing regardless of the pressing position.

Figure 10:
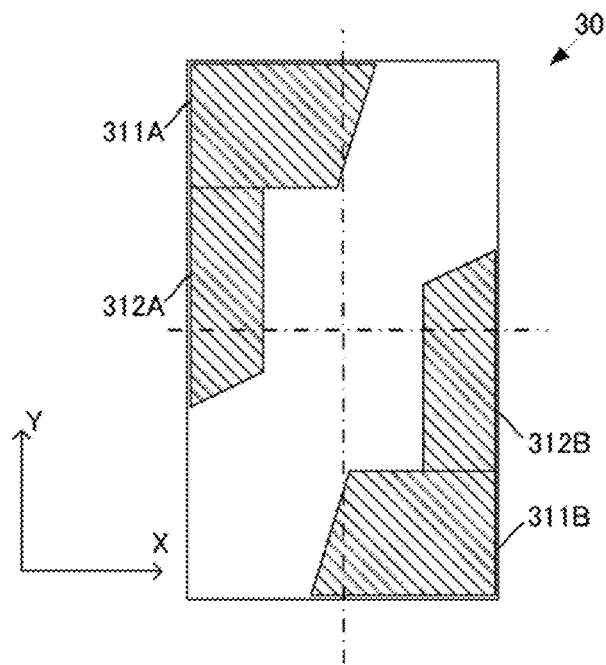
FIG. 10 is a plan view showing the arrangement of the detection electrode of the pressing sensor.

Further, the extension part does not have to be comb-shaped. For example, as shown in FIG. 10, the extension part 312A and the extension part 312B may have the same shape as the solid part 311A and the solid part 311B. Also in the example of FIG. 10, the extension part 312A and the extension part 312B are longest at the X-direction end, and become shorter toward the center. Further, the extension part 312A and the extension part 312B are arranged across the first region and the second region that generate the positive potential to the third region and the fourth region that generate negative potential. Therefore, the pressing sensor 30 can detect the pressing regardless of the pressing position.

Finally, the description of the above embodiments is illustrative in all aspects and is not restrictive. The scope of the present invention is defined by the terms of the claims, rather than the embodiments described above. Furthermore, it is intended that the scope of the present invention includes the meaning equivalent to the scope of the claims and all modifications within the scope of the claims.

DESCRIPTION OF REFERENCE SYMBOLS

1: Display device
20: Touch sensor
21: First electrode
22: Insulating board
23: Second electrode
30: Pressing sensor
31: Detection electrode
31A: First detection electrode
31B: Second detection electrode
32: Piezoelectric film
33: Ground electrode
40: Surface panel
50: Housing
70: Adhesive
80: Circuit board
311A: Solid part
311B: Solid part
312A: Extension part
312B: Extension part
351: Ground electrode

The invention claimed is:

1. A pressing sensor comprising:
a piezoelectric film having a chiral polymer drawn at least in a uniaxial direction, and having a first main surface and a second main surface;
first and second detection electrodes arranged on one or both of the first and second main surfaces, the first and second detection electrodes facing each other obliquely to the uniaxial direction, at least one of the first and second detection electrodes having an extension part which extends along the uniaxial direction, at least a portion of the extension part being longer than half a length of a long side of the piezoelectric film.

2. The pressing sensor according to claim 1, wherein the extension part has a plurality of finger like extensions.

3. The pressing sensor according to claim 2, wherein the portion of the extension part is one of the finger like extensions.

4. The pressing sensor according to claim 1, wherein the piezoelectric film has a rectangular shape, and the uniaxial direction is arranged at an angle of 0±10 degrees with respect to a side of the piezoelectric film.

5. The combination of the pressing sensor according to claim 1 and a touch sensor configured to detect a touch operation, the touch sensor having a plurality of detection electrodes, each of the finger like extensions having a shape corresponding to a shape of a respective one of the detection electrodes of the touch sensor.

6. A pressing sensor comprising:
a piezoelectric film having a chiral polymer drawn at least in a uniaxial direction, and having a first main surface and a second main surface;
first and second detection electrodes arranged on one or both of the first and second main surfaces, the first and second detection electrodes facing each other obliquely to the uniaxial direction, at least one of the first and second detection electrodes having an extension part extending along the uniaxial direction, the extension part having a portion longer than half a length of a long side of the piezoelectric film.

7. The pressing sensor according to claim 6, wherein the extension part has a plurality of finger like extensions.

8. The pressing sensor according to claim 6, wherein the piezoelectric film has a rectangular shape, and the uniaxial direction is arranged at an angle of 0±10 degrees with respect to a side of the piezoelectric film.

9. The combination of the pressing sensor according to claim 6 and a touch sensor configured to detect a touch operation, the touch sensor having a plurality of detection electrodes, each of the finger like extensions having a shape corresponding to a shape of a respective one of the detection electrodes of the touch sensor.

* * * * *